United States Patent
Churchwell, II et al.

(10) Patent No.: US 9,893,697 B1
(45) Date of Patent: Feb. 13, 2018

(54) SYSTEM AND METHOD FOR SELECTIVE VOLUME ADJUSTMENT IN A VEHICLE

(71) Applicant: Ford Global Technologies, LLC, Dearborn, MI (US)

(72) Inventors: Howard E. Churchwell, II, Monroe, MI (US); Mahmoud Yousef Ghannam, Canton, MI (US); John Jensen, Canton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 15/627,174

(22) Filed: Jun. 19, 2017

(51) Int. Cl.
| | |
|---|---|
| *H03G 3/20* | (2006.01) |
| *H03G 3/32* | (2006.01) |
| *H04R 29/00* | (2006.01) |
| *G10L 21/0224* | (2013.01) |
| *G06K 9/00* | (2006.01) |
| *G10L 21/0216* | (2013.01) |
| *H03G 3/24* | (2006.01) |

(52) U.S. Cl.
CPC ............ *H03G 3/32* (2013.01); *G06K 9/00791* (2013.01); *G06K 9/00832* (2013.01); *G10L 21/0224* (2013.01); *H04R 29/001* (2013.01); *G10L 2021/02163* (2013.01); *H03G 3/24* (2013.01); *H04R 2499/13* (2013.01)

(58) Field of Classification Search
CPC ........ H03G 3/32; H03G 3/24; G06K 9/00791; G06K 9/00832; G10L 21/0224; G10L 2021/02163; H04R 29/001; H04R 2499/13
See application file for complete search history.

(56) References Cited

U.S. PATENT DOCUMENTS

| 4,641,344 | A | 2/1987 | Kasai et al. |
|---|---|---|---|
| 5,434,922 | A | 7/1995 | Miller et al. |
| 7,606,376 | B2 | 10/2009 | Eid et al. |
| 8,594,345 | B2 | 11/2013 | Hess |
| 8,964,998 | B1 | 2/2015 | McClain |
| 9,077,814 | B2 | 7/2015 | Lee |
| 9,208,767 | B2 | 12/2015 | Su et al. |
| 2013/0287215 | A1* | 10/2013 | Kim .................... H04M 1/6016 381/57 |

OTHER PUBLICATIONS

Smart AVC, The World's Smartest Automatic Volume Control, Starmark Incorporated.

* cited by examiner

*Primary Examiner* — Andrew L Sniezek
(74) *Attorney, Agent, or Firm* — James P. Muraff; Neal, Gerber & Eisenbeg LLP (57) ABSTRACT

Systems and methods for automatically adjusting volume in a vehicle are provided. One method includes generating a noise prediction based on images received from a vehicle camera; determining a cabin noise level based on the noise prediction and an audio signal detected by a cabin microphone; and selectively amplifying a quiet passage within the detected audio signal to above the cabin noise level while maintaining volume level of remaining passages within the detected signal. A vehicle system includes a cabin microphone for detecting an audio signal; a camera for capturing images; and a processor configured to: generate a noise prediction based on the images; determine a cabin noise level based on the noise prediction and the detected audio signal; and selectively amplify a quiet passage within the detected signal to above the cabin noise level while maintaining volume level of remaining passages within the detected signal.

15 Claims, 4 Drawing Sheets

SYSTEM AND METHOD FOR SELECTIVE VOLUME ADJUSTMENT IN A VEHICLE

TECHNICAL FIELD

This application generally relates to vehicle audio systems, and more specifically, to providing volume adjustment during select passages of an audio file.

BACKGROUND

Driving in automotive vehicles is become an increasingly quieter experience. For example, most vehicles utilize sound damping materials and passenger compartment designs to help isolate vehicle occupants from unwanted engine and road noise. Some automotive vehicles include active noise control (ANC) systems designed to cancel or reduce noise levels to help provide a quieter and more peaceful driving experience. In addition to engine sounds and road rumble, other unwanted noises in the vehicle cabin can include wind noise, sounds from other vehicle occupants, and noise generated by the vehicle's heating, ventilation, and air conditioning (HVAC) unit. ANC systems may include one or more microphones within the vehicle cabin detecting cabin noise levels and/or one or more microphones at other locations to pick up other noise sources (e.g., in the engine block).

Some vehicles include a speed-compensated volume (SCV) feature, or speed-sensitive volume control, that automatically adjusts the volume of audio being played through the vehicle's audio or sound system as the vehicle's speed changes, for example, to compensate for road and wind noise as the vehicle accelerates. The speed-volume compensation typically occurs in the background, and the volume adjustment may be achieved by applying a gain to the audio signal in a spectrally varying manner, so that the listener is unaware of the change in volume. The original volume level may be automatically restored once the noise source disappears (e.g., once the car stops accelerating).

Some audio recordings exhibit a wide dynamic range, or a large variation in loudness between notes or phrases. For example, in classical music pieces, certain audio passages within the piece may have a low volume or amplitude (e.g., pianissimo), while other audio passages within the piece have a high volume or amplitude (e.g., fortissimo), even though an overall volume level remains constant during playback of the piece. When playing such audio recordings in a vehicle sound system, the low volume passages may become inaudible due to ambient noise that is louder than that passage, while the high volume passages may become excessively loud, for example, if the volume level had been previously increased to compensate for a pianissimo passage. In such situations, vehicle operators manually adjust the volume up and/or down to compensate for the variation in sound level. For some classical music pieces, volume adjustments are required frequently or in quick succession because the pieces are designed to have fortissimo or forte passages immediately followed by piano or pianissimo passages, and/or vice versa. Such manual volume adjustments can be both bothersome and distracting to the driver.

Accordingly, there is still a need in the art for vehicle sounds systems and methods that can automatically adjust the audio output volume to compensate for ambient noise while also compensating for dynamic sound levels within a given audio recording.

SUMMARY

The invention is intended to solve the above-noted and other problems through systems and methods that include, among other things, (1) selectively amplifying quiet passages to above a cabin noise level and/or selectively de-amplifying loud passages to below a predetermined loud threshold, while maintaining a constant audio level for other passages in the same audio file, and (2) using an active noise predictor to at least partially determine the cabin noise level, where the active noise predictor generates noise predictions based on images captured by vehicle cameras of road/vehicle conditions and/or vehicle occupants.

For example, one embodiment provides a method of automatically adjusting volume in a vehicle. The method includes generating a noise prediction based on images received from at least one vehicle camera; determining a cabin noise level based on the noise prediction and an audio signal detected by a cabin microphone; and selectively amplifying at least one quiet passage within the detected audio signal to above the cabin noise level while maintaining volume level of remaining passages within the detected signal.

Another example embodiment includes a vehicle system comprising a cabin microphone for detecting an audio signal; at least one camera for capturing images; and a processor configured to: generate a noise prediction based on the images; determine a cabin noise level based on the noise prediction and the detected audio signal; and selectively amplify at least one quiet passage within the detected signal to above the cabin noise level while maintaining volume level of remaining passages within the detected signal.

As will be appreciated, this disclosure is defined by the appended claims. The description summarizes aspects of the embodiments and should not be used to limit the claims. Other implementations are contemplated in accordance with the techniques described herein, as will be apparent to one having ordinary skill in the art upon examination of the following drawings and detail description, and such implementations are intended to within the scope of this application.

BRIEF DESCRIPTION OF THE DRAWINGS

For a better understanding of the invention, reference may be made to embodiments shown in the following drawings. The components in the drawings are not necessarily to scale and related elements may be omitted, or in some instances proportions may have been exaggerated, so as to emphasize and clearly illustrate the novel features described herein. In addition, system components can be variously arranged, as known in the art. Further, in the drawings, like reference numerals designate corresponding parts throughout the several views.

DETAILED DESCRIPTION OF EXAMPLE EMBODIMENTS

While the invention may be embodied in various forms, there are shown in the drawings, and will hereinafter be described, some exemplary and non-limiting embodiments, with the understanding that the present disclosure is to be considered an exemplification of the invention and is not intended to limit the invention to the specific embodiments illustrated.

In this application, the use of the disjunctive is intended to include the conjunctive. The use of definite or indefinite articles is not intended to indicate cardinality. In particular, a reference to "the" object or "a" and "an" object is intended to denote also one of a possible plurality of such objects.

Figure 1:
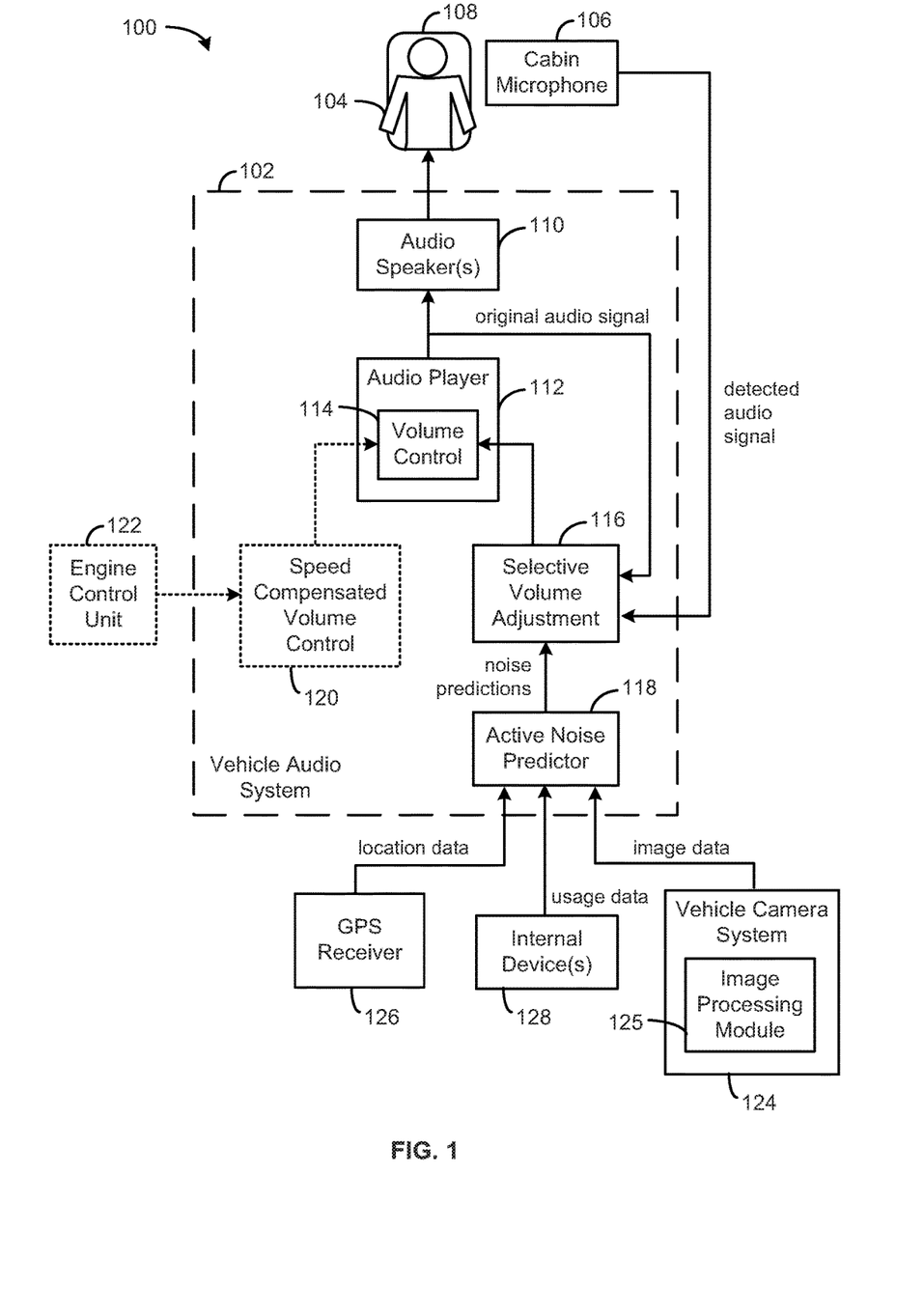
FIG. 1 is an illustration of an exemplary vehicle system, in accordance with certain embodiments.

FIG. 1 illustrates an exemplary vehicle system 100, in accordance with embodiments. The vehicle system 100 may be included in any type of vehicle (not shown) and may include more components than those shown. The vehicle system 100 comprises an audio system 102 for outputting an audio signal to a vehicle occupant 104, such as a driver or operator of the vehicle. The audio signal may be a music signal or any other type of audio. The vehicle system 100 further includes at least one microphone 106 located in a cabin area of the vehicle for picking up or detecting sounds present in the vehicle cabin. The detected sounds or audio signal can include ambient noise in the vehicle cabin and the audio signal output by the audio system 102.

The microphone 106 can include any type of microphone or other sensor suitable for detecting audio signals within the vehicle cabin. In embodiments, the microphone 106 (also referred to herein as "cabin microphone") may be positioned adjacent to an outer ear of the driver 104, for example, on or near a front driver seat 108 (e.g., within the headrest of the driver seat 108, in a front pillar adjacent to the driver seat 108, or in a headliner or roof area adjacent to the driver seat 108). As a result, the audio signal measured by the cabin microphone 106 may be representative of the audio signal being received at the driver's ear (e.g., including both music and noise signals). An output of the microphone 106 (e.g., the detected audio signal) is provided to the audio system 102 for processing, as described in more detail below.

The cabin noise detected by the microphone 106 can emanate from noise sources located inside the vehicle cabin and/or outside the vehicle. For example, external cabin noise can include, wind noise, road noise, engine noise, and other externally-generated sounds. Internal cabin noise can include noise generated by heating and cooling units, noise generated by other vehicle occupants (e. in-person conversations or singing), audio being output by personal electronic devices (e.g., mobile phone, tablet, handheld video game player, etc.), audio being output through speakers 110 of the audio system 102, and other internally-generated sounds.

As shown, the audio system 102 includes one or more audio speakers 110 and an audio player 112. The audio speaker(s) 110 may be positioned at one or more locations throughout the vehicle cabin, and in some cases, may be separated into left and right speakers configured to receive left and right components of a stereo audio signal. In embodiments, the speakers 110 include any type of audio speaker suitable for audio playback within the vehicle cabin and can include, for example, woofers, sub-woofers, tweeters, super-tweeters, and mid-range speakers. The audio player 112 may be an AM/FM radio, CD player, MP3 player, or other media player configured to playback an audio recording, such as, for example, a musical piece.

The audio player 112 comprises a volume control unit 114 for controlling a sound or volume level of the audio signal output by the audio speakers 110. The volume control unit 114 includes a manual or hardware-based component (e.g., knob, dial, button, slider, soft key, touch input, etc.) that allows the user to manually control the gain of the audio output by selecting a discrete volume level. The volume levels may range from a minimum value (e.g., zero) to a maximum value (e.g., ten) and may vary depending on the particular audio system. In embodiments, the volume control unit 114 also includes an automatic or software-based component that automatically adjusts the volume level of the audio output in response to one or more inputs or commands designed to remove or mitigate the masking effect caused by ambient noise. In some cases, each volume control input includes a selected one of the discrete volume levels associated with manual volume control. In other cases, each volume control input is a value selected from a continuous spectrum of volume levels.

As shown in FIG. 1, the volume control unit 114 receives one or more volume control inputs from a selective volume adjustment module 116 included in the audio system 102. According to embodiments, the selective volume adjustment (SVA) module 116 can be configured (e.g., using software instructions executing on a processor) to provide volume control inputs for either selectively amplifying portions of the original audio signal that are too quiet as compared to a noise level in the vehicle cabin (also referred to herein as "quiet passages"), or selectively de-amplifying portions of the original audio signal that are too loud as compared to a predetermined loudness threshold (also referred to herein as "loud passages"). The SVA module 116 determines appropriate volume control inputs based, at least in part, on noise predictions generated by an active noise predictor 118 and the detected audio signal received from the cabin microphone 106 (also referred to herein as a "microphone signal"), as described in more detail below.

In embodiments, the SVA module 116 identifies which portions of the original audio signal are "quiet passages" by first determining an ambient noise level within the vehicle cabin (also referred to herein as a "cabin noise level"), as perceived by the listener (e.g., vehicle driver). In particular, the SVA module 116 receives the original audio signal (e.g., the music signal) from the audio player 112 and the microphone signal (e.g., the music and noise signal) from the microphone 106 and compares the two signals to obtain a cabin noise signal. For example, the SVA module 116 may apply known digital signal processing techniques to the received signals to remove the original audio signal from the microphone signal, thus isolating the noise signal. The SVA module 116 may then use the extracted noise signal to determine the cabin noise level, or an amplitude of the noise signal that is masking at least a portion of the original audio signal in the vehicle cabin.

In embodiments, the SVA module 116 uses the cabin noise level to identify which audio passages of the original audio signal have a volume or signal level that is lower than the cabin noise level and therefore, are likely to be masked by the noise signal (i.e. quiet passages). For each identified quiet passage, the SVA module 116 then provides an appropriate volume control input to the volume control unit 114, so that only the quiet passages are boosted above the cabin noise level. In embodiments, the volume adjustment, or amount of gain applied, for each quiet passage is selected so that the signal to noise ratio (SNR) of the microphone signal is increased to match the volume or signal level of the original audio signal. The volume adjustment may be applied on top of, or in addition to, the volume level selected for the audio signal, as a whole, using the volume control unit 114. The SVA module 116 may determine the SNR of the microphone signal using known techniques. For example, the SVA module 116 may continuously measure a loudness of the microphone signal and a loudness of the original audio signal, determine a loudness of the noise signal based on these measurements, and calculate the SNR for the microphone signal based on the loudness of the microphone signal and the loudness of the noise signal.

In some embodiments, the SVA module 116 also compares the audio passages of the original audio signal to a predetermined loudness threshold to determine which of the passages have a high volume level that exceeds the loudness threshold (i.e. loud passages). For each identified loud passage, the SVA module 116 provides an appropriate volume control input to the volume control unit 114, so that only the loud passages are reduced to below the loudness threshold. In embodiments, the amount of volume adjustment may be selected so that the amplitude of the audio passage falls just below the loudness threshold. This volume adjustment may be applied on top of, or in addition to, the overall volume level selected for the audio signal.

In some cases, the audio system 102 also includes a speed-compensated volume (SCV) control module 120 for providing one or more volume control inputs to the volume control unit 114. The SCV control module 120 adjusts the volume level of output audio based on information received from an engine control unit 122. The engine control unit 122 provides information associated with an engine block of the vehicle, including, for example, acceleration information (e.g., whether the vehicle is accelerating or decelerating), speed information (e.g., a current speed of the vehicle), and engine noise information (e.g., a noise level measured by one or more microphones located in the engine block of the vehicle). Based on the received information, the SCV control module 120 can determine a noise level that is related to the vehicle engine and may be masking all or portions of the audio signal being output to the vehicle cabin. Using known techniques, the SCV control module 120 determines an amount of gain required to compensate for the noise level of the vehicle engine and automatically increases the volume level of output audio accordingly. When the noise level drops (e.g., when the vehicle stops accelerating), the SCV control module 120 automatically decreases the volume level back to the original level. Typically, the user is oblivious to these volume adjustments, as they occur in the background (e.g., without user input).

In embodiments that include the SCV module 120, the volume control inputs received from the SVA module 116 are applied to the audio signal separate from, and in addition to, the volume control inputs received from the SCV control module 120. This is because, while the speed-compensated volume adjustments from the SCV control module 120 can control the overall volume level of the audio output, these adjustments, alone, cannot compensate for low volume passages within the audio signal (e.g., passages masked by cabin noise) without causing the other, louder passages to become excessively loud, or compensate for high volume passages without causing other, quieter passages to become too low. By contrast, the selective volume adjustments from the SVA module 116 can identify select audio passages or portions of the audio signal requiring separate volume adjustment, such as, e.g., low volume passages masked by cabin noise or excessively loud passages, and selectively adjust the volume level of the identified audio passages, without affecting the remaining portions of the audio signal. Thus, applying selective volume adjustments to the output audio, in addition to speed-compensated volume control, can provide a fuller listening experience for the user.

In embodiments, the SVA module 116 uses noise predictions received from the active noise predictor 118 to refine the cabin noise level determined based on the microphone signal. The active noise predictor 118 generates a noise prediction based on real-time, or near real-time, data received from one or more sources, such as, for example, image data from a vehicle camera system 124, location data from a global positioning system (GPS) receiver 126 or other location data receiver, and/or usage data from one or more electrical devices 126 located in the vehicle cabin (also referred to herein as "internal devices"). The active noise predictor 118 evaluates the received data to identify a new or potential noise source and forms a noise prediction based on the identified noise source. In some embodiments, the noise prediction instructs the SVA module 116 to re-measure the cabin noise signal, for example, by re-measuring the detected audio signal, comparing the new signal to the original audio signal, and extracting a new cabin noise signal from the comparison. The SVA module 116 then calculates a new cabin noise level based on the new cabin noise signal. In other embodiments, the noise prediction identifies the potential noise source and instructs the SVA module 116 to obtain more data about the noise from the noise source itself (e.g., if one of the internal devices 128 is streaming audio) or from the GPS receiver 126 (e.g., if location data is needed to pinpoint the noise source).

In embodiments, the vehicle camera system 124 is configured to capture images of an interior of the vehicle (e.g., the vehicle cabin) and/or an exterior of the vehicle (e.g., the vehicle surroundings). The captured images can be scanned or analyzed by an image processing module 125 included in, or electrically coupled to, the vehicle camera system 124 for identifying potential noise sources. In particular, the image processing module 125 may be configured to recognize certain characteristics of the captured images as belonging to a potential noise source based on data stored in a database (such as, e.g., noise source database 422 shown in FIG. 4). The image processing module 125 may use known image processing techniques, including feature extraction, to identify the noise-related characteristics of the captured images.

In some cases, for example, the images of the vehicle interior or cabin may include pictures of any vehicle occupants and personal electronic devices being used by each occupant, if any. In such cases, the image processing module 125 can analyze the interior images to determine a number of vehicle occupants and a number and/or identity of any personal electronic devices being used by each occupant and identify each occupant and/or device as a potential noise source. In some cases, the image processing module 125 can further analyze the occupant images to identify noise-related characteristics, including, for example, whether the vehicle occupant(s) are talking (e.g., to each other or in a phone call), crying (e.g., an infant), fighting (e.g., between two children), singing (e.g., along with the output audio or a personal audio device), or making other forms of noise. Likewise, in some cases, the image processing module 125 can further analyze the device images to identify noise-related characteristics, including, for example, whether an audio signal is being output by the device (e.g., due to play of a video game, movie, or other type of video), whether the device user is wearing headphones or other personal listening device, etc. This and other data obtained by the image processing module 125 may be provided to the active noise predictor 118 to generate one or more noise predictions.

As another example, in some cases, the images of the vehicle exterior may include images of the surroundings of the vehicle, including forward, rear, left side, and/or right side views, depending on the number and location(s) of the camera(s). In such cases, the image processing module 125 can analyze the exterior images to identify certain characteristics about the vehicle's surroundings that may contribute to vehicle cabin noise, including, for example, new road conditions (e.g., upcoming pothole(s), nearby construction site, highway versus local road, etc.), traffic conditions (e.g., presence or absence of other vehicles, upcoming traffic light, traffic signal, stop sign, etc.), weather (e.g., rain, thunder, snow, hail, etc.), and/or environmental conditions (e.g., desert, forest, ocean-side, suburb, urban or metropolitan area, etc.). This and other data obtained by the image processing module 125 may be provided to the active noise predictor 118 to generate one or more noise predictions. For example, the image processing module 125 may determine, based on the captured images, that the vehicle is approaching a stop sign. Based on this information, the active noise predictor 118 may determine that the cabin noise level will at least momentarily drop while the vehicle is stopped at the stop sign. The image noise predictor 118 may provide a new noise prediction to the selective volume adjustment module 116 in anticipation of this drop in cabin noise. Accordingly, the SVA module 116 may lower the cabin noise level and correspondingly lower any volume adjustments applied to quiet passages of the audio signal. Once the vehicle passes the stop sign and starts to accelerate again, the SVA module 116 will automatically increase the cabin noise level and re-amplify any volume adjustments for quiet passages, as needed.

In embodiments, the information received from the vehicle camera system 124 is combined with information received from other sources in order to pinpoint or refine the potential noise source and the projected noise level associated therewith. For example, in some embodiments, location data received from the GPS receiver 126 can be used to confirm and/or enhance the vehicle surroundings data obtained by the image processor. The location data can also provide additional information about the vehicle surroundings, such as, for example, an exact geographical location of the vehicle, expected traffic conditions on the road ahead of the vehicle or on a selected route for the vehicle, etc. For example, the image data may indicate that the vehicle is sitting in traffic (e.g., based on captured images showing the presence of cars on all four sides of the vehicle), while the location data can identify exactly which street and/or intersection (e.g., cross streets) and what traffic and/or road conditions to expect next in the vehicle's direction of travel. As another example, the image data may indicate that the vehicle is on or near a highway (e.g., based on captured images showing a highway sign), while the location data can identify exactly which highway and whether the vehicle is entering, exiting, or traveling on the highway. The active noise predictor 118 may receive the location data directly from the GPS receiver 126 or through a data bus coupled to both devices (e.g., vehicle data bus 406 shown in FIG. 4).

As another example, in some embodiments, usage data received from the internal device(s) 128 can be used to confirm and/or enhance the vehicle occupants/devices data obtained by the image processing module 125 of the vehicle camera system 124. The usage data may include whether the device 128 is a wireless device capable of streaming audio/visual content and whether the device 128 is currently streaming such content, whether the device 128 is a media player capable of playing audio/visual content stored in a memory or other data storage device (e.g., DVD or CD) and whether the device 128 is currently playing such content, etc. The usage data can also provide additional information about the vehicle interior, such as, for example, an exact audio signal output by the personal electronic devices, a volume level of the output audio, noise-related characteristics of any personal listening device being used (e.g., noise-cancelling, etc.), etc. As an example, the image data may indicate that the vehicle occupant is using a tablet, while the usage data can identify whether the tablet is outputting audio into the vehicle cabin and if so, a volume level and/or sound characteristics of the audio signal. In some cases, the internal device(s) 128 includes one or more components of the vehicle, such as, for example, a body control module (e.g., BCM 412 shown in FIG. 4) for controlling the electronic doors and windows, heating and cooling systems, and other internal systems of the vehicle. In such cases, the BCM provides usage data that indicates, for example, whether the vehicle windows or doors are open, whether A/C or heating unit is blowing air and if so, a velocity or the air or a setting of the blower/vents, or other information about noise sources within the vehicle cabin. The active noise predictor 118 may receive the usage data directly from each internal device 128 included in the vehicle cabin via a wireless connection (e.g., Bluetooth), or indirectly through a data bus (e.g., vehicle data bus 406 shown in FIG. 4) coupled to a vehicle telematics unit (e.g., telematics control unit 408 shown in FIG. 4) that is in wireless communication with the internal device 128.

Figure 2:
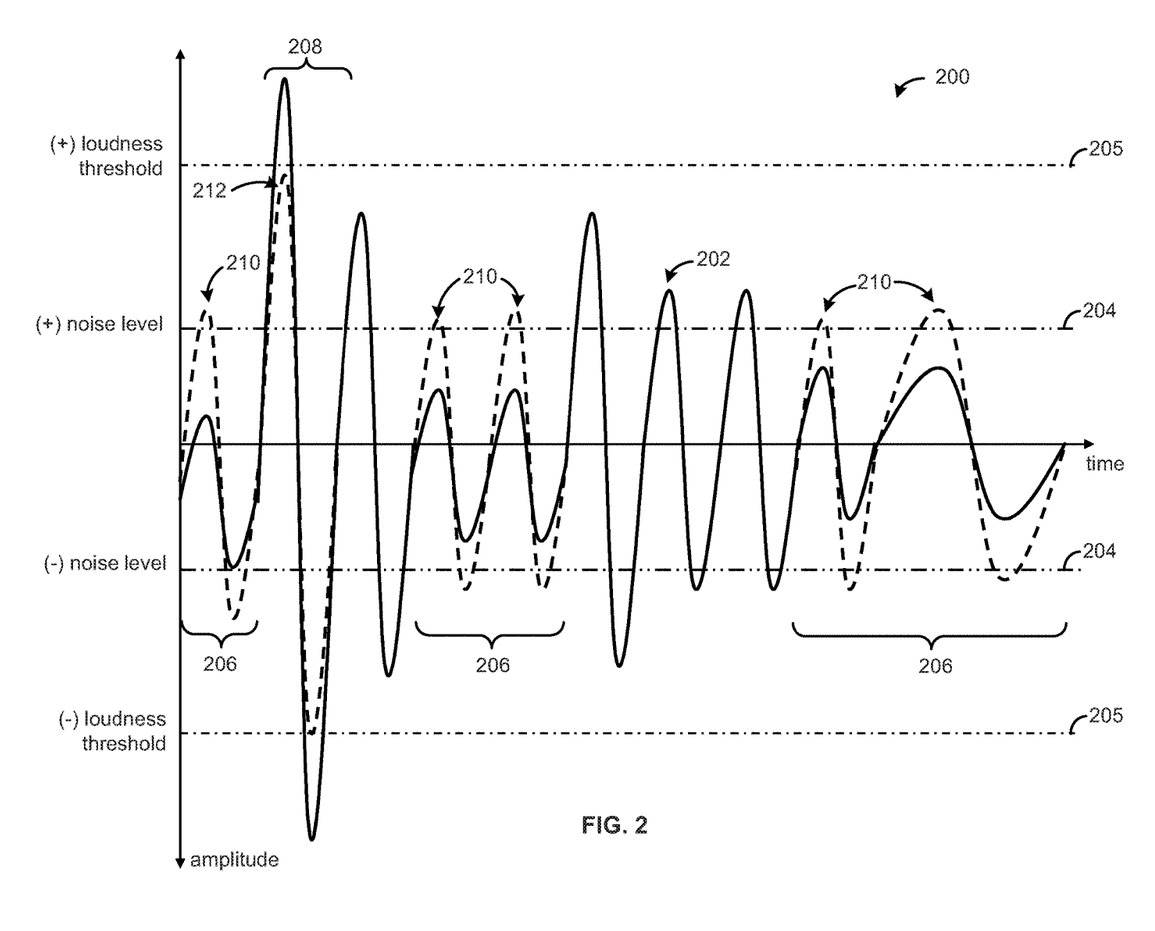
FIG. 2 is a graph showing selective amplification and de-amplification of select passages of an exemplary audio signal, in accordance with certain embodiments.

Referring now to FIG. 2, shown is a graph 200 of an exemplary original audio signal 202 (drawn in solid lines) provided to the audio speakers 110 by the audio player 112 and a noise level 204 representing the noise signal present in the vehicle cabin, as determined by the SVA module 116 of FIG. 1, in accordance with embodiments. The noise signal masks, or makes inaudible, any portion of the audio signal 202 that falls below, or has an amplitude that is smaller than that of, the noise level 204. In embodiments, volume adjustments are applied by the SVA module 116 to select passages of the original audio signal to increase or a decrease the amplitude of those passages, depending on the signal to noise ratio of the microphone signal and/or whether a predetermined loudness threshold 205 has been exceeded. While FIG. 2 shows the loudness threshold 205, the cabin noise level 204, and the audio signal 202 as having positive (+) and negative (−) components, the discussion of FIG. 2 will be in terms of absolute values to simplify the description and facilitate understanding. In some embodiments, the selective volume adjustment module 116 is able to predetermine which audio passage may be one of the quiet passages 206 based on a frequency range of the passage. For example, a bassoon solo within a classical music piece typically has a very low frequency range (e.g., 4.5 octaves), and therefore, is more likely to be masked by cabin noise.

In embodiments, the volume control 114 for the audio system 102 is set to a constant volume during capture of the audio signal 202 shown in FIG. 2. Thus, the variations in amplitude of the audio signal 202 are due to the wide dynamic range of the underlying audio recording, or the audio file being played by the audio player 112. Certain variations correspond to one or more passages or segments of the audio file that have a very low amplitude, such as quiet passages 206, while other variations correspond to one or more passages or segments of the audio file that have a very high amplitude, such as loud passage 208. In the case of a classical music piece, the quiet passages 206 may correspond to pianissimo, piano, or other very low volume segments of the musical piece, and the loud passage 208 may correspond to fortissimo or other very loud volume segment of the musical piece.

As shown in FIG. 2, the quiet passages 204 of the audio signal 202 are completely masked by the noise signal because the amplitudes of the quiet passages 206 are entirely below the cabin noise level 204. In embodiments, the SVA module 116 is configured to automatically increase the amplitudes of these quiet passages 206 to above the cabin noise level 204, while maintaining the amplitudes of the remaining passages of the audio signal 202. This technique enables the quiet passages 206 to be at least audible to the listener (e.g., vehicle driver) during playback in a noisy cabin. Moreover, by automatically applying the additional gain to only those passages 206 that need amplification, the technique avoids altering playback of the audio passages that are already audible above the noise level 204, or accidentally playing these other audio passages at excessively loud volumes. This is shown in FIG. 2, where only the quiet passages 206 have had their amplitudes boosted or increased to above the cabin noise level 204 by applying selective volume adjustments 210 (drawn in dashed lines) thereto. The other passages of the audio signal 202 have not been amplified.

The amount of amplification associated with each volume adjustment 210 may be determined by the SVA module 116 based on the signal to noise ratio (SNR) of the microphone signal and the loudness of the original audio signal 202. For example, the volume adjustment 210 may be equal to the amount of gain that would be required to match the SNR of the detected audio signal to the sound level of the original audio signal 202.

As shown in FIG. 2, an amplitude of the loud passage 208 is above the predetermined loudness threshold 205, or a maximum amplitude permitted for playback of the audio signal 202 within the vehicle cabin. A volume adjustment 212 is applied to the loud passage 208 to decrease the amplitude of the loud passage 208 to at or below the loudness threshold 205. In some cases, the loudness threshold 205 is selected to avoid high volume levels that distort the sound of the audio signal 202 and/or cause an unpleasant or uncomfortable listening experience. The loudness threshold 205 may be preselected by the manufacturer of the vehicle or manually set by the vehicle operator or other user.

Figure 4:
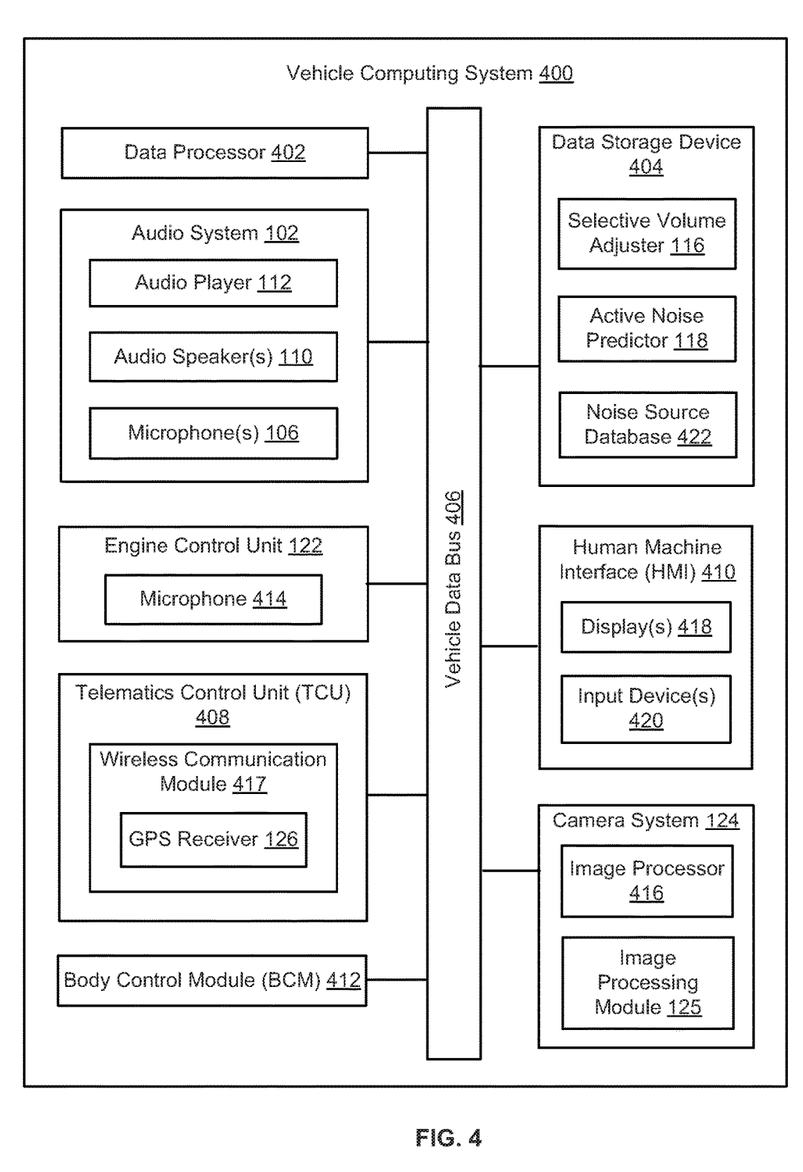
FIG. 4 is a block diagram showing an exemplary vehicle computing system comprising the vehicle system of FIG. 1, in accordance with certain embodiments.

Referring back to FIG. 1, various components of the audio system 102 can be included in the vehicle cabin, the vehicle computing system of the vehicle, or on an external device in communication with a telematics unit of the vehicle (such as, e.g., telematics control unit 408 shown in FIG. 4). In embodiments, the audio system 102 can be communicatively coupled to a vehicle computing system (such as, e.g., vehicle computing system (VCS) 400 shown in FIG. 4) of the vehicle in order to carry out the features of the invention. As shown in FIG. 1, the selective volume adjustment module 116 of the audio system 102 can be communicatively coupled to the audio player 112, the cabin microphone 106, and the active noise predictor 118, and the active noise predictor 118 can be communicatively coupled to the GPS receiver 126, the internal device(s) 128, and the vehicle camera system 124. In some cases, the selective volume adjustment module 116, the active noise predictor 118, and the image processing module 125 can be integrated into one control module. In some cases, the selective volume adjustment module 116 may be integrated into the audio player 112 and/or the volume control unit 114. In embodiments, the components of the audio system 102 can communicate with each other and/or components of the vehicle computing system using wired or wireless connections. If communicating wirelessly, the audio system 102 may further include one or more transmitters (not shown) for wirelessly transmitting output signals to other components.

According to embodiments, each of the selective volume adjustment module 116, the active noise predictor 118, and the image processing module 125 can be implemented in hardware, software, or a combination thereof. In some embodiments, the modules 116, 118, and/or 125 comprise program modules or software instructions stored in a data storage device (such as, e.g., data storage device 404 shown in FIG. 4) and executed by a data processor (such as, e.g., data processor 402 shown in FIG. 4) of the vehicle computing system, as described in more detail below. In other embodiments, the audio system 102 can include an electronic control unit (ECU) or other electronic data processor configured to execute the modules 116, 118, and/or 125, for example, using software instructions stored in a memory of the audio system 102.

Figure 3:
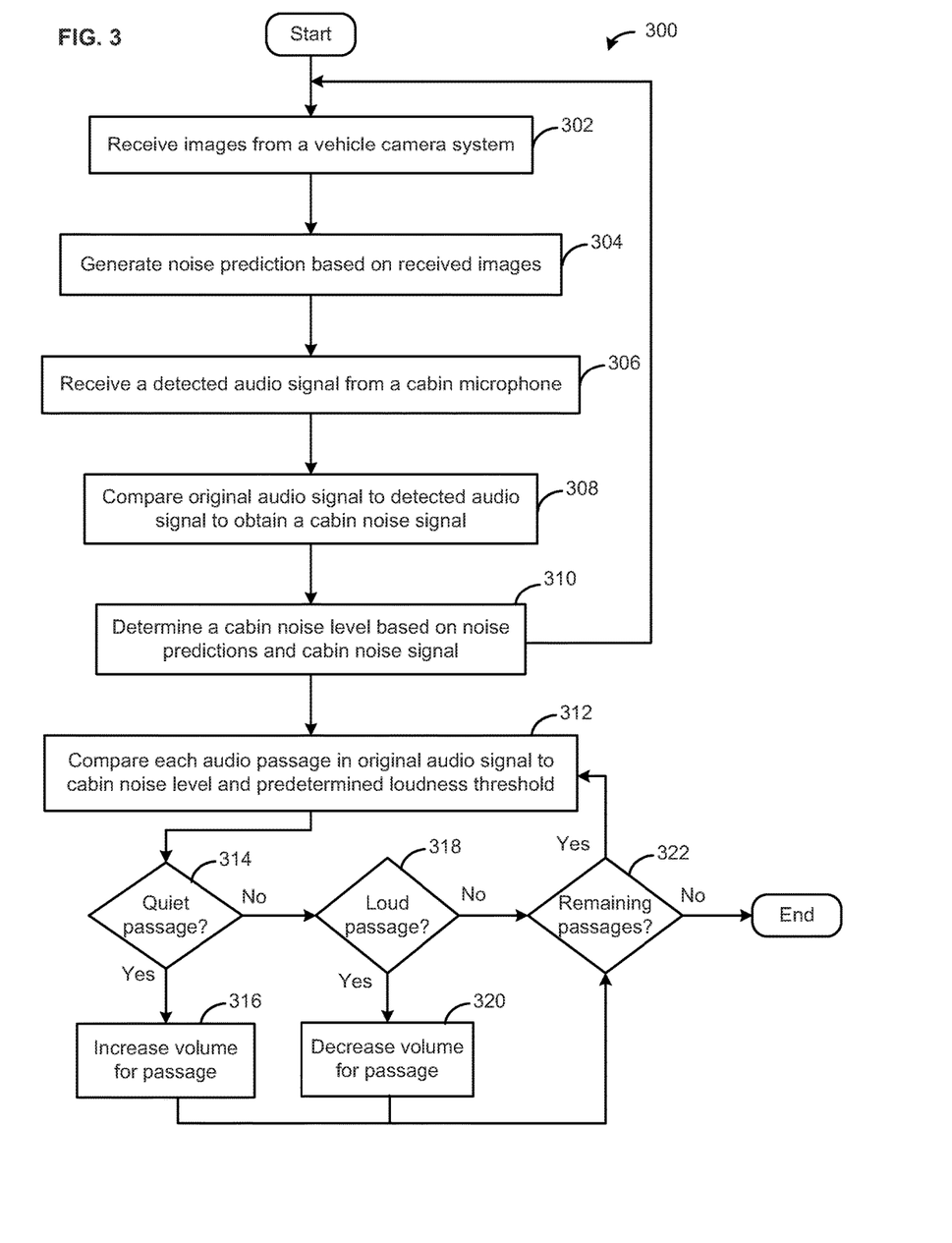
FIG. 3 is a flow diagram of an example method of automatically adjusting volume in a vehicle, in accordance with certain embodiments.

FIG. 3 illustrates an example method 300 of automatically adjusting volume in a vehicle, in accordance with embodiments. The method 300 can be carried out by one or more processors (or controllers) included in, for example, a vehicle audio system (such as, e.g., the vehicle audio system 102 shown in FIG. 1) and/or a vehicle computing system (such as, e.g., the vehicle computing system (VCS) 400 shown in FIG. 4). In one embodiment, the method 300 is implemented, at least in part, by data processor 402 of the VCS 400 executing software stored in data storage device 404, such as, e.g., the selective volume adjustment module 116, the active noise predictor 118, and/or the image processing module 125, and interacting with one or more components of the VCS 400 and/or the vehicle audio system 102 included therein.

The method 300 can begin at step 302, where the processor receives images from a vehicle camera system (such as, e.g., vehicle camera system 124 shown in FIG. 1). At step 304, the processor generates a noise prediction based on the received images. The images may include information related to external surroundings of the vehicle and/or an internal space of the vehicle, including vehicle occupants in the vehicle cabin. The noise predictions may be generated by using the image processing module 125 to extract features from the images that indicate the presence of a potential noise source (e.g., construction zone or highway sign outside the vehicle, occupants inside the vehicle, etc.). In some cases, the noise predictions are further generated or refined based on vehicle location data obtained from a wireless receiver (e.g., GPS receiver 126 shown in FIG. 1) and/or usage data received from an electronic device located in the vehicle cabin (e.g., internal device(s) 128 shown in FIG. 1).

At step 306, the processor receives a detected audio signal from a cabin microphone (such as, e.g., microphone 106 shown in FIG. 1). At step 308, the processor compares an original audio signal provided for output to the vehicle cabin (e.g., via audio speakers 110 shown in FIG. 1) to the detected audio signal to obtain a cabin noise signal. For example, the processor may remove the original audio signal from the detected audio signal, the remainder being the cabin noise signal. At step 310, the processor determines a cabin noise level based on the noise predictions generated at step 304 and the cabin noise signal obtained at step 308. In some cases, the processor continuously refines the cabin noise signal based on new noise predictions. For example, as shown, the method 300 may continuously loop through or perform steps 302 to 310 in order to check for new noise sources based on the captured images received at 302 and if a new noise prediction is identified at step 304, re-measure the detected audio signal at step 306, and re-calculate the cabin noise signal at step 308.

At step 312, the processor compares each audio passage in the original audio signal (e.g., audio signal 202 shown in FIG. 2) to the cabin noise level determined at step 310 (e.g., cabin noise level 204 shown in FIG. 2) and a predetermined loudness threshold (e.g., loudness threshold 205 shown in FIG. 2) to identify passages that are quieter than the cabin noise level (e.g., quiet passages 206 shown in FIG. 2) and passages that are louder than the loudness threshold (e.g., loud passages 208 shown in FIG. 2). As will be appreciated, the cabin noise level used in step 312 may be continuously updated as the method 300 continues to cycle through steps 302 to 310 while also moving forward with steps 312 to 322.

At step 314, the processor determines whether a given passage is quiet, or has a volume level that is lower than the cabin noise level. If the determination is "yes," the method 300 continues to step 316, where the processor increases the volume (or amplifies) the quiet passage identified at step 314. If the determination at step 314 is "no," the method 300 continues to step 328, where the processor determines whether the given passage is loud, or has a volume level that is higher than the loudness threshold. If the determination at step 318 is "yes," the method 300 continues to step 320, where the processor decreases the volume (or de-amplifies) the loud passage identified at step 314. If the determination at step 318 is "no," and after completion of step 316 or step 320, the method 300 continues to step 322, where the processor determines whether there are additional audio passages in the audio file. If the determination is "yes," the method 300 continues back to step 312, where the processor selects another audio passage for analysis and steps 314 through 322 may be repeated. If the determination at step 322 is "no" (i.e. there are no more audio passages to analyze), the method 300 may end after step 322.

Referring now to FIG. 4, shown is an example vehicle computing system (VCS) 400 that may be included in a vehicle, for example, as part of a vehicle electronics system or an infotainment system of the vehicle, in accordance with embodiments. The VCS 400 may be an infotainment system such as the SYNC® system manufactured by FORD MOTOR COMPANY®. Other embodiments of the VCS 400 can include different, fewer, or additional components than those described below and shown in FIG. 4. In embodiments, all or portions of the VCS 400 can be included in the vehicle system 100 shown in FIG. 1.

As illustrated, the VCS 400 includes a data processor 402 (e.g., an electronic data processor), data storage device 404 (e.g., electronic memory), and a vehicle data bus 406. The VCS 400 can further include various electronic control units (ECUs) responsible for monitoring and controlling the electrical systems or subsystems of the vehicle. Each ECU may include, for example, one or more inputs and outputs for gathering, receiving, and/or transmitting data, a memory for storing the data, and a processor for processing the data and/or generating new information based thereon. In the illustrated embodiment, the ECUs of the VCS 400 include the audio system 102, engine control unit 122, camera system 124, telematics control unit (TCU) 408, human-machine interface (HMI) 410, and body control module (BCM) 412. Though not shown, the VCS 400 may include other ECUs, such as, for example, a transmission control module for controlling and monitoring the transmission of the vehicle.

The ECUs of the VCS 400 are interconnected by the vehicle data bus 406 (such as, e.g., a controller area network (CAN) bus or an automotive Ethernet bus), which passes data to and from the various ECUs, as well as other vehicle and/or auxiliary components in communication with the VCS 400. Further, the data processor 402 can communicate with any one of the ECUs and the data storage device 404 via the data bus 406 in order to carry out one or more functions, including the functions associated with the audio system 102.

The engine control unit 122 is an ECU for controlling and monitoring the engine of the vehicle. In some embodiments, the engine control unit 122 is combined with the transmission control unit and included in a single ECU, such as, a powertrain control module (PCM). As shown, the engine control unit 122 can include, or be communicatively coupled to, an engine microphone 414 for detecting or capturing a sound of the engine and can provide the engine sound signal to the audio system 102, or more specifically, the SCV control module 120, via the vehicle data bus 406.

As illustrated, the audio system 102 can include, or be communicatively coupled to, the audio speaker(s) 110, the audio player 112, and the cabin microphone 106 shown in FIG. 1. The audio player 112 can include an AM/FM radio receiver or tuner, an amplifier for driving an audio signal to the speakers 110 or other audio output devices, and one or more media devices (e.g., tape player, CD player, DVD player, satellite radio, auxiliary devices, etc.). In some embodiments, the audio system 102 forms part of a pre-installed infotainment system or other original equipment manufacturer (OEM) system of the vehicle. In other embodiments, the audio system 102 comprises a head unit that is installed in the vehicle after-market, for example, by coupling the head unit to the speakers 110 and other OEM components of the vehicle computing system 400.

As shown, the vehicle computing system 400 may comprise the vehicle camera system 124. The vehicle camera system 124 includes a plurality of cameras positioned at various locations on the vehicle. At least one of the cameras may be configured to capture images of an area outside the vehicle. For example, the camera system 124 may include a front view camera, a rear view camera, a left view camera, and/or a right view camera respectively positioned at front, rear, left, and/or right sides of the vehicle in order to capture a field of view surrounding or at least partially surrounding the vehicle. Also, at least one of the cameras may be configured to capture images of an interior of the vehicle. For example, the camera system 124 may include a camera located in a front portion of the vehicle cabin and positioned so as to capture the front and back portions of the cabin, including any vehicle occupants seated therein.

In some cases, the vehicle camera system 124 can be implemented as an electronic control unit (ECU) comprising a separate memory for storing the image processing module 125, or other program modules or software instructions for carrying out the image processing techniques described herein, and a separate image processor 416 (e.g., a graphics processing unit (GPU)) for executing the instructions stored in the ECU memory. In other cases, the vehicle camera system 124 provides images captured by the cameras to the data processor 402 for processing in accordance with instructions stored in the data storage device 404. In such cases, the image processing module 125 may be stored in the data storage device 404.

The TCU 408 can be an ECU for enabling the vehicle to connect to one or more wireless networks, such as, for example, WiFi, WiMax, cellular (e.g., GSM, GPRS, LTE, 3G, 4G, CDMA, etc.), Bluetooth, near-field communication (NFC), radio-frequency identification (RFID), satellite, dedicate short-range communication (DSRC), Global Positioning System (GPS), and infrared networks. In embodiments, the TCU 408 includes a wireless communication module 417 comprising one or more antennas, radios, modems, receivers, and/or transmitters (not shown) for connecting to, or interfacing with, the various wireless networks. For example, as shown, the wireless communication module 417 can include the GPS receiver 126 or other location determining receiver for wirelessly receiving location and/or route data.

In some cases, the TCU 408 can receive external data via the wireless communication module 417 from one or more external devices (not shown) associated with the vehicle, such as, for example, a key fob (not shown), a user device paired to the vehicle, and/or a remote server communicatively coupled to the TCU 408. In such cases, the TCU 408 provides the received external data to an appropriate ECU of the VCS 400. In some cases, the TCU 408 can also receive internal data from one or more ECUs and/or the data processor 402 with instructions to transmit the internal data to an external device associated with the vehicle.

For example, the TCU 408 can enable the VCS 400, or the audio system 102, to pair with a user device (e.g., mobile phone, tablet, personal computer, etc.) of the vehicle operator (e.g., one of the internal devices 128 shown in FIG. 1), using Bluetooth, WiFi, cellular, or other wireless communication network and/or via a remote server associated with a manufacturer of the vehicle, the VCS 400, and/or an infotainment system of the vehicle, such as the FORD SYNC® system. The VCS 400 can receive usage data from the internal device(s) 128 via the TCU 408 and can provide the received usage data to the audio system 102 for processing by the active noise predictor 118.

As another example, the TCU 408 can enable the VCS 400, or the audio system 102, to receive location data from a location-determining satellite communicatively coupled to the GPS receiver 126. The VCS 400 can provide the received location data to the active noise predictor 118, via the vehicle data bus 406, for generating noise predictions based thereon.

The human-machine interface (HMI) 410 (also referred to as a "user interface") can be an ECU for enabling user interaction with the vehicle and for presenting vehicle information to the vehicle operator or driver. The HMI 410 includes one or more displays 418 for displaying vehicle information, such as, for example, navigation system information, audio system information, video captured by vehicle cameras 124, heating and air/conditioning information, etc. The HMI 410 can further include can one or more input device(s) 420 and/or one or more output devices (not shown) for inputting, entering, receiving, capturing, displaying, or outputting data associated with the vehicle computing system 400, the audio system 102, and/or the techniques disclosed herein. The input devices 420 can include keys, buttons, knobs, dials, sliders, touchscreens or other touch inputs, or any other device capable of receiving user inputs or selections.

The HMI 410 can be configured to interact with the other ECUs of the VCS 400 and/or the data processor 402 via the data bus 406 in order to provide information or inputs received via the HMI 410 to an appropriate component of the VCS 400 and to present, to the vehicle operator or occupant, information or outputs received from the various components of the VCS 400. For example, when the HMI 410 receives inputs intended for controlling one or more aspects of the audio system 102 (e.g., via the input devices 420), the HMI 410 can send the inputs to the audio system 102 via the vehicle data bus 406.

The BCM 412 is an ECU for controlling and monitoring various electronic accessories in a body of the vehicle, including components within the vehicle cabin. For example, the BCM 412 may include a power doors control unit for controlling the vehicle doors, including locking, unlocking, opening, and/or closing the doors; a power windows control unit for controlling the vehicle windows and/or a power roof unit (e.g., moonroof, sunroof, convertible top, etc.), including opening and closing the windows or the roof unit; an air conditioning and/or heating control unit for controlling an air-condition unit and a heating unit of the vehicle. In some embodiments, the BCM 412 may be one of the internal devices 128 shown in FIG. 1 configured to provide usage data to the active noise predictor 118 of the audio system 102 via the vehicle data bus 406. For example, the usage data may indicate when the vehicle windows or moonroof are opened, thus creating a new noise source in the vehicle cabin. The usage data may also indicate when the air-conditioning or heating unit of the vehicle is turned on and to what extend the air is blowing (e.g., high, low, etc.), as the blowing air forms another noise source in the vehicle cabin. Information about these and other internal noise sources may be used by the active noise predictor 118 to form noise predictions, which are then provided to the SVA module 116 to refine volume adjustments to select passages of the output audio.

The data processor 402 can comprise one or more of a microprocessor, a microcontroller, a programmable logic array, an application-specific integrated circuit, a logic device, or other electronic device for processing, inputting, outputting, manipulating, storing, or retrieving data. In embodiments, the VCS 400 can comprise a general purpose computer that is programmed with various programming instructions or modules stored in the data storage device 404, or elsewhere.

The data storage device 404 can comprise one or more of electronic memory, nonvolatile random access memory (e.g., RAM), flip-flops, a computer-writable or computer-readable storage medium, a magnetic or optical data storage device, a magnetic or optical disc drive, a hard disk drive, or other electronic device for storing, retrieving, reading, or writing data. The data storage device 404 stores one or more software program modules or software instructions, including the selective volume adjustment module 116, the active noise predictor 118, and/or the image processing module 125 for execution by the data processor 402.

As shown in FIG. 4, in some cases, the data storage device 404 also stores a noise source database 422 configured to store, for example, noise source information for identifying a potential noise source based on capture images. The noise source information may include visual characteristics that can be used by the image processor 416 to identify a particular noise source. The image processor 416 may identify a potential noise source by extracting features from the captured images and matching the extracted features to characteristics stored in the noise source database 422 for a given noise source. For example, the image processor 416 may identify a construction zone by extracting features related to construction signs from the captured images and matching the features to stored images of construction signs. In some embodiments, the noise source database 422 may be stored in a memory of the camera system 124 instead.

In certain embodiments, the process descriptions or blocks in the figures, such as FIG. 3, can represent modules, segments, or portions of code which include one or more executable instructions for implementing specific logical functions or steps in the process. Any alternate implementations are included within the scope of the embodiments described herein, in which functions may be executed out of order from that shown or discussed, including substantially concurrently or in reverse order, depending on the functionality involved, as would be understood by those having ordinary skill in the art.

It should be emphasized that the above-described embodiments, particularly, any "preferred" embodiments, are possible examples of implementations, merely set forth for a clear understanding of the principles of the invention. Many variations and modifications may be made to the above-described embodiment(s) without substantially departing from the spirit and principles of the techniques described herein. All such modifications are intended to be included herein within the scope of this disclosure and protected by the following claims.

The invention claimed is:

1. A method of automatically adjusting volume in a vehicle, comprising:
   generating a noise prediction based on images received from at least one vehicle camera;
   determining a cabin noise level based on the noise prediction and an audio signal detected by a cabin microphone; and
   selectively amplifying at least one quiet passage within the detected audio signal to above the cabin noise level while maintaining volume level of remaining passages within the detected signal.

2. The method of claim 1, further comprising selectively decreasing an amplitude of at least one loud passage within the detected audio signal to below a predetermined loud threshold while maintaining the volume level of the remaining passages.

3. The method of claim 1, wherein the images include information related to vehicle surroundings.

4. The method of claim 1, wherein the images include information related to vehicle occupants.

5. The method of claim 1, further comprising generating the noise prediction based further on vehicle location data obtained from a wireless receiver.

6. The method of claim 1, further comprising generating the noise prediction based further on usage data received from an electronic device located in a vehicle cabin.

7. The method of claim 1, wherein determining the cabin noise level includes comparing the detected audio signal to an original audio signal provided to a vehicle speaker to obtain a cabin noise signal.

8. A vehicle system, comprising:
   a cabin microphone for detecting an audio signal;
   at least one camera for capturing images;
   a processor configured to:
   generate a noise prediction based on the images;
   determine a cabin noise level based on the noise prediction and the detected audio signal; and
   selectively amplify at least one quiet passage within the detected signal to above the cabin noise level while maintaining volume level of remaining passages within the detected signal.

9. The vehicle system of claim 8, wherein the processor is further configured to selectively decrease an amplitude of at least one loud passage within the detected audio signal to below a predetermined loud threshold while maintaining the volume level of the remaining passages.

10. The vehicle system of claim 8, wherein the at least one camera is configured to capture images of an area outside the vehicle.

11. The vehicle system of claim 10, wherein the processor generates the noise prediction based on vehicle surroundings data obtained from the captured images.

12. The vehicle system of claim 8, wherein the at least one camera is configured to capture images of an area inside the vehicle.

13. The vehicle system of claim 12, wherein the processor generates the noise prediction based on vehicle occupant data obtained from the captured images.

14. The vehicle system of claim 8, further comprising a wireless receiver for obtaining vehicle location data, the processor generating the noise prediction based further on the vehicle location data.

15. The vehicle system of claim 8, further comprising an audio speaker for outputting an original audio signal, wherein the processor is configured to determine the cabin noise level by comparing the detected audio signal to the original audio signal to obtain a cabin noise signal.

* * * * *